United States Patent [19]
Wang

[11] Patent Number: 6,087,216
[45] Date of Patent: Jul. 11, 2000

[54] METHOD OF MANUFACTURING DRAM CAPACITOR

[75] Inventor: Chuan-Fu Wang, Taipei Hsien, Taiwan

[73] Assignee: United Microelectronics Corp., Taiwan

[21] Appl. No.: 09/195,760

[22] Filed: Nov. 18, 1998

[51] Int. Cl.[7] .............................................. H01L 21/8242
[52] U.S. Cl. ........................ 438/253; 438/254; 438/396; 438/397
[58] Field of Search ..................................... 257/306, 307, 257/308, 309, 532; 438/253, 254, 255, 396, 397, 398

[56] References Cited

U.S. PATENT DOCUMENTS 5,464,787  11/1995  Ryou ........................................ 438/396
5,468,670  11/1995  Ryou ........................................ 438/253
5,571,742  11/1996  Jeong ....................................... 438/254
5,688,726  11/1997  Kim ......................................... 438/397

*Primary Examiner*—Carl Whitehead, Jr.
*Assistant Examiner*—Toniae M. Thomas
*Attorney, Agent, or Firm*—Ratner & Prestia

[57] ABSTRACT

A method of manufacturing a DRAM capacitor utilizes spacers to form a self-aligned node contact, and thus is able to reduce the cross-sectional dimensions of the node contact. Moreover, the spacers are capable of protecting any portion of a bit line that may be exposed due to misalignment when contact opening is formed. Hence, short-circuiting of the device can be prevented. Furthermore, by shaping the lower electrode of the capacitor into a fork-shaped structure with four prongs, the surface area for capacitor coupling is increased, thus increasing the capacitance of the capacitor, as well.

14 Claims, 17 Drawing Sheets

METHOD OF MANUFACTURING DRAM CAPACITOR

BACKGROUND OF THE INVENTION

1. Field of Invention

The present invention relates to a method of manufacturing integrated circuits. More particularly the present invention relates to a method of manufacturing the capacitor of a dynamic random access memory (DRAM).

2. Description of Related Art

DRAM is a type of high-density integrated circuit on a silicon chip widely used in the electronic industry for storing digital information. Digital information is stored in the capacitor of a memory unit. Normally, the value stored within a memory cell depends on the amount of electric charges a capacitor is holding at a particular moment. Each memory unit has a particular set of peripheral circuits that serve to store and retrieve data.

After years of development, a memory unit now comprises a transfer field effect transistor (TFET) and a storage capacitor, only. FIG. 1 is a circuit diagram showing a single memory unit of a DRAM device. As shown in FIG. 1, the charged or discharged state of a capacitor C can be used for storing digital data. The most common memory configuration is to store a single bit of data in each capacitor C. When the capacitor C is fully discharged, a logic value of "0" is held. On the other hand, when the capacitor C is fully charged, the logic value of "1" is held.

There is a dielectric layer 102 between the upper electrode 101 and the lower electrode 100 of the capacitor C. The dielectric layer 102 provides a dielectric constant between the electrodes 100 and 101. The lower electrode 100 of the capacitor C is connected to a bit line through a transfer field effect transistor T so that charging and discharging of the capacitor can be carried out. In fact, the source terminal of the transistor T is connected to the bit line BL while the drain terminal is connected to the lower electrode 100. In addition, the gate terminal is connected to a word line WL so that connection between the bit line BL and the capacitor can be selected through controlling the signal sent to the word line WL.

As the number of transistor devices within a given chip increases, dimensions of each transistor must shrink and the transistors must be closer to each other. Therefore, when a capacitor is charged, keeping the signal-to-noise ratio below a certain threshold may be difficult. On the other hand, if the amount of charges stored in each capacitor is reduced to counteract noise generation, capacitor refresh frequency may increase.

Since the area occupied by a capacitor is restricted by the size of each memory cell, the only means to increase the capacitance of a capacitor is to utilize the third dimension. In other words, three-dimensional capacitors must be used. The most common types of three-dimensional capacitor structures include the trench type, the cylindrical type and the stack type. Because the trench type is more difficult to fabricate, it is rarely used nowadays. The cylindrical type and the stack type of capacitor extend vertically upwards. Since both the cylindrical and stack type of capacitor are capable of considerably increasing the capacitance and are easier to produce, they are used more frequently.

FIGS. 2A through 2G are schematic, cross-sectional views showing the progression of steps in a manufacturing process for producing a conventional cylindrical capacitor in DRAM.

First, as shown in FIG. 2A, a silicon substrate 200 having a MOS transistor (not shown) thereon is provided. Then, an oxide layer 202 and a silicon nitride layer 204 are sequentially formed over the substrate 200. The silicon nitride layer 204 serves as a barrier layer in subsequent etching operation.

Next, as shown in FIG. 2B, photolithographic and etching processes are carried out to pattern the silicon nitride layer 204 and the oxide layer 202 to form a contact window opening 206. The contact window opening 206 exposes a portion of the substrate 200, for example, a doped region of the MOS device. Thereafter, a polysilicon layer 208 is deposited over the silicon nitride layer 204 such that the contact window opening 206 is completely filled.

Next, as shown in FIG. 2C, the polysilicon layer 208 is etched back to form a polysilicon layer 208a whose top surface is level with the silicon nitride layer 204.

In the subsequent step, as shown in FIG. 2D, an oxide layer 210 is formed over the silicon substrate 200, and then photolithographic and etching processes are again carried out to pattern the oxide layer 210 to form an opening 212. The opening 212 exposes a portion of the polysilicon layer 208a and the silicon nitride layer 204. Then, another polysilicon layer 214 is formed over the substrate 200. The polysilicon layer 214 covers the opening 212 and the oxide layer 210 so that the polysilicon layer 214 and the polysilicon layer 208a are in contact with each other. Thereafter, an oxide layer 216 is formed over the polysilicon layer 214.

Next, as shown in FIG. 2E, the oxide layer 216 is etched back using the polysilicon layer 214 as an etching end point. After that, the polysilicon layer 214 is also etched back using the oxide layer 210 as another etching end point. Ultimately, a polysilicon layer 214a and an oxide layer 216a are retained within the opening 212.

Next, as shown in FIG. 2F, a wet etching operation is carried out to remove the remaining oxide layer 216a and oxide layer 210 using the silicon nitride layer 204 as an etching barrier layer.

Thereafter, as shown in FIG. 2G, an insulation layer 218 is formed over the substrate 200. The insulation layer 218, for example, can be an oxide/nitride/oxide (ONO) composite layer. Finally, a polysilicon layer 220 is deposited over the insulation layer 218 to form a complete cylindrical DRAM capacitor.

However, the aforementioned method of fabricating cylindrical capacitor requires several photolithographic and etching operations with different masks. Since the dimensions of devices are reduced with each newer generation of silicon chip, making node contacts that align correctly with the intended source/drain region on a substrate will be very difficult.

In light of the foregoing, there is a need to provide an improved method of fabricating cylindrical DRAM capacitor.

SUMMARY OF THE INVENTION

Accordingly, the present invention provides a method of manufacturing a DRAM capacitor that utilizes spacers for self-aligning the node contact, thus reducing the schematic, cross-sectional dimensions required to form a node contact. Moreover, the spacers are capable of protecting any bit line that may be exposed due to misalignment when contact opening is formed. Therefore, short-circuiting of the device can be prevented. Furthermore, by shaping the lower electrode of the capacitor into a fork-shaped structure with four prongs, surface area for capacitor coupling can be increased and hence raise the capacitance of the capacitor.

To achieve these and other advantages and in accordance with the purpose of the invention, as embodied and broadly described herein, the invention provides a method of manufacturing DRAM capacitor. The method includes the steps of providing a semiconductor substrate that has a gate structure and a word line already formed thereon. Then, a first dielectric layer is deposited over substrate covering both the gate structure and the word line. Next, a bit line running through the first dielectric layer is formed between the word line and the gate structure. Thereafter, a second dielectric layer is deposited over the bit line and the first dielectric layer, and then an insulation layer is deposited over the second dielectric layer. Subsequently, a portion of the insulation layer and the second dielectric layer are removed to form a via hole between two adjacent gate structures exposing a portion of the substrate. Next, insulating spacers are formed on the sidewalls of the via hole. After that, a node contact opening that leads to the substrate is formed by etching the first dielectric layer through the insulating spacers. Thereafter, a first polysilicon layer is deposited over the insulation layer and completely fills the node contact opening, and then an oxide layer and a second polysilicon layer are sequentially formed over the first polysilicon layer. In the subsequent step, a mask patterning operation is carried out to remove the second polysilicon layer outside the node contact region using the oxide layer as an etching barrier layer. Then, using the first polysilicon layer as an etching barrier layer, oxide spacers are formed on the sidewalls of the remaining second polysilicon layer while oxide layer is removed in other areas. Next, the remaining second polysilicon layer and the exposed first polysilicon layer are removed. Thereafter a portion of the oxide layer between the oxide spacers is removed. Subsequently, polysilicon spacers are formed on the sidewalls of the oxide spacers, and then the oxide spacers are removed to form a lower electrode having a fork-shaped structure with four prongs. Finally, a dielectric thin film and an upper electrode layer are sequentially formed over the lower electrode structure to form a complete DRAM capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
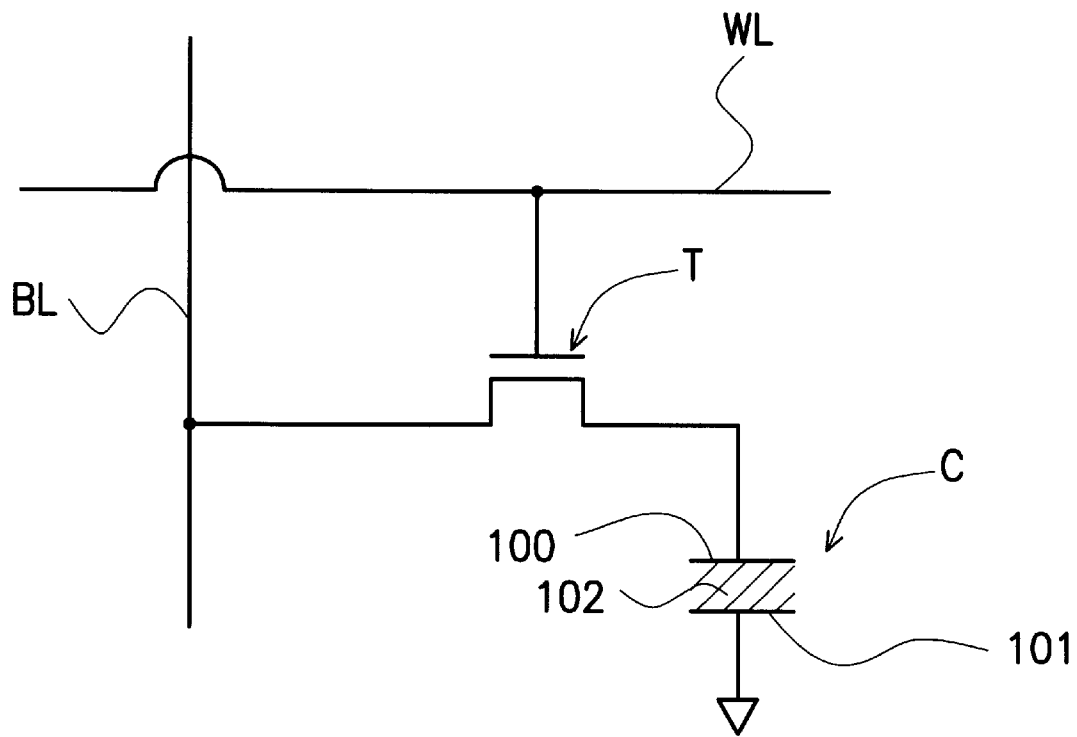
FIG. 1 is a circuit diagram showing a single memory unit of a DRAM device.
Figure 2A:
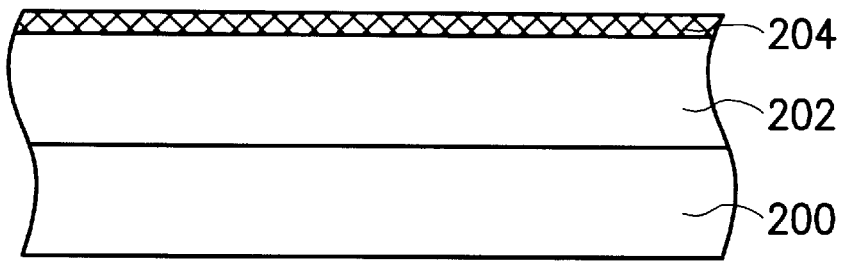
FIGS. 2A through 2G are schematic, cross-sectional views showing the progression of manufacturing steps in producing a conventional cylindrical capacitor in a DRAM.
Figure 2B:
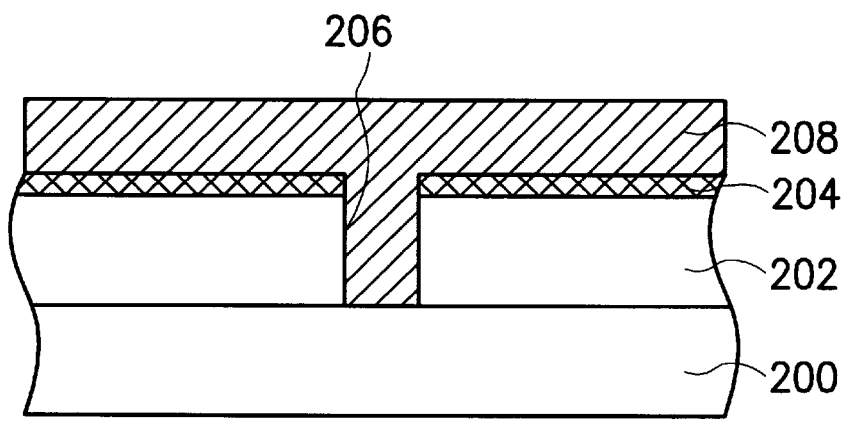
Figure 2C:
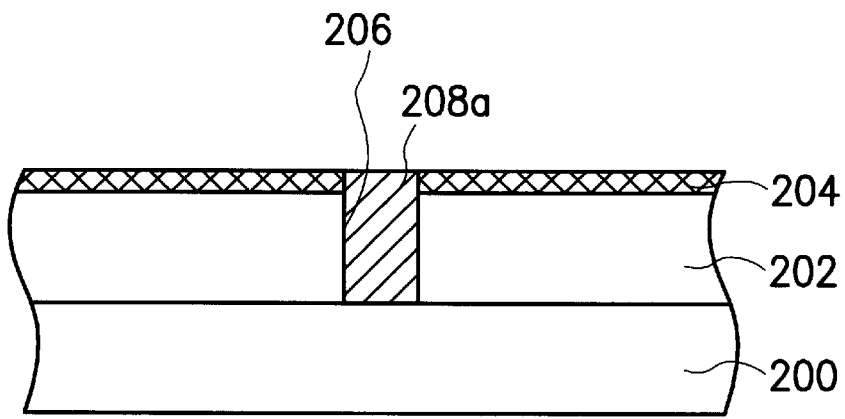
Figure 2D:
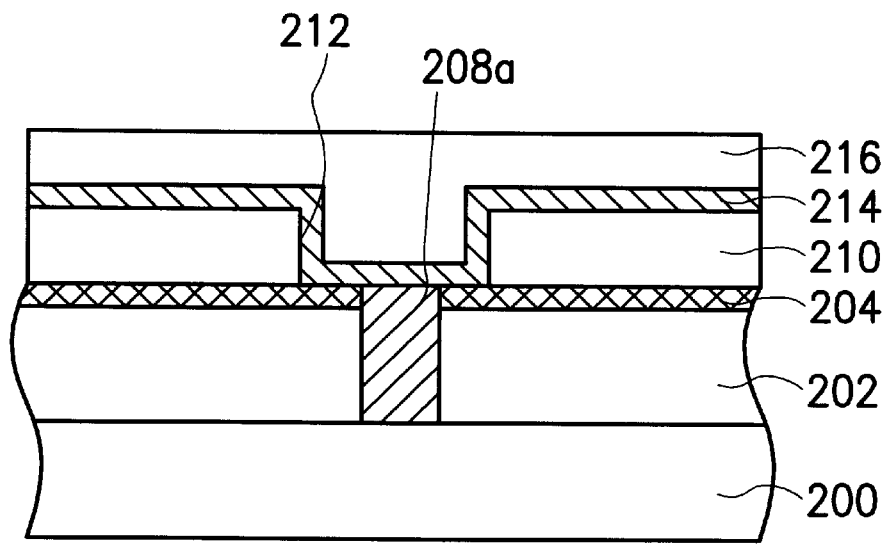
Figure 2E:
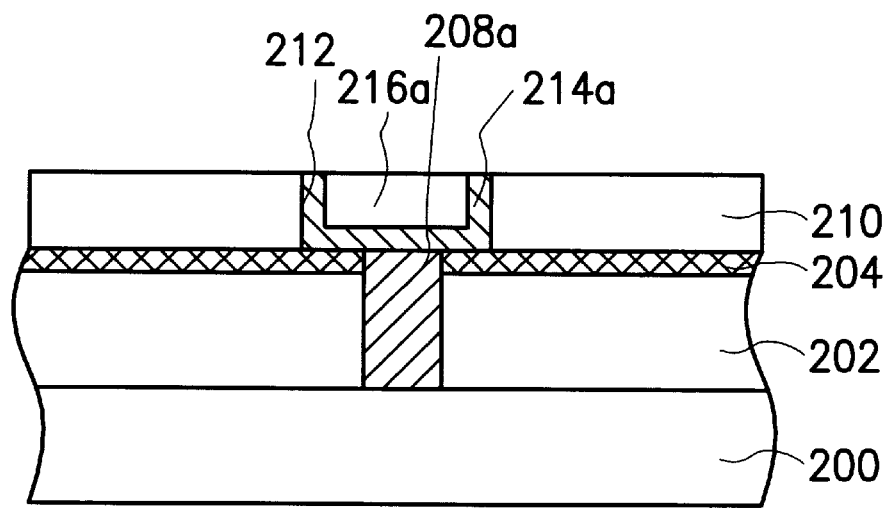
Figure 2F:
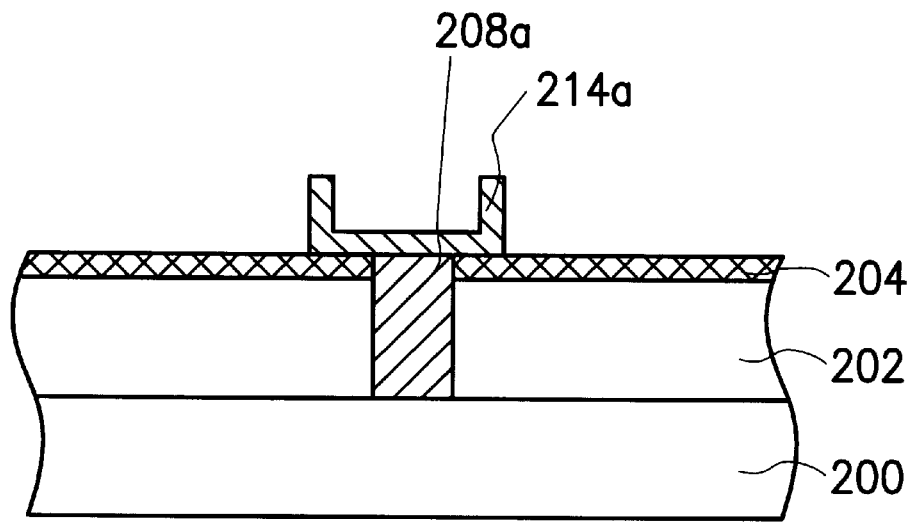
Figure 2G:
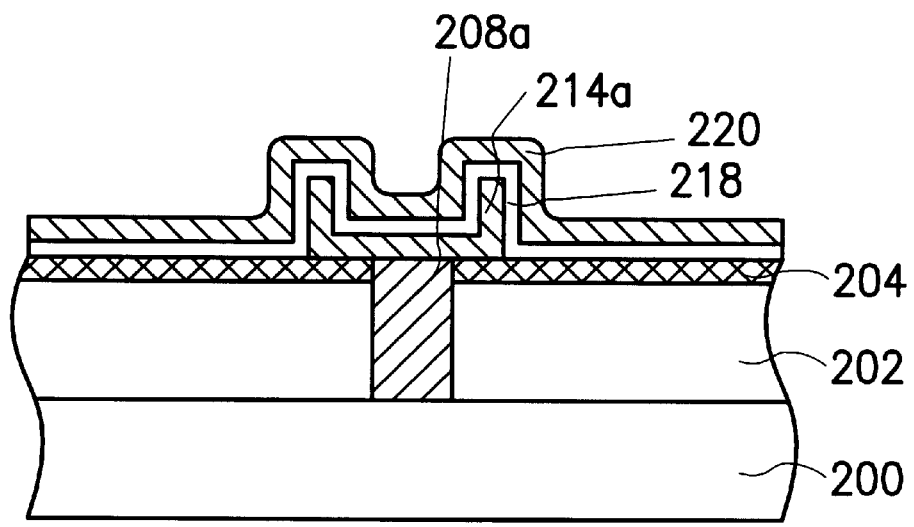

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3M are schematic, cross-sectional views taken along the X-axis while FIGS. 4A through 4M are schematic, cross-sectional views taken along the Y-axis showing the progression of steps in a manufacturing process for fabricating a DRAM capacitor according to one preferred embodiment of this invention.

Figure 3A:
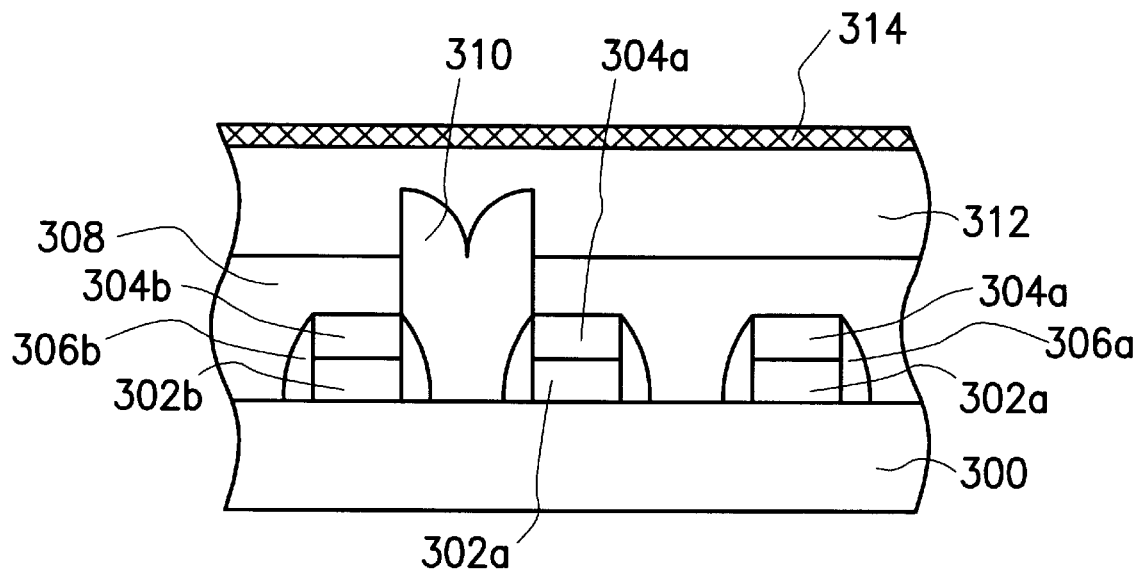
FIGS. 3A through 3M are schematic, cross-sectional views taken along the X-axis showing the progression of steps in a manufacturing process for fabricating a DRAM capacitor according to one preferred embodiment of this invention.
Figure 4A:
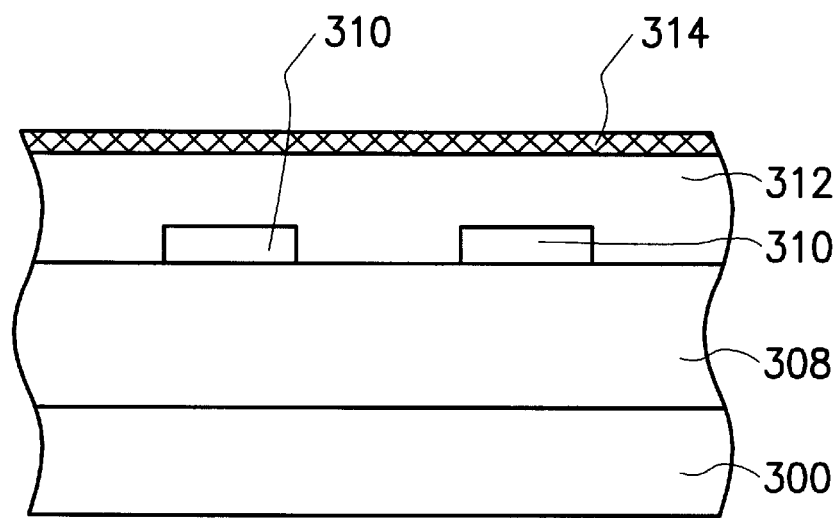
FIGS. 4A through 4M are schematic, cross-sectional views taken along the Y-axis showing the progression of steps in a manufacturing process for fabricating a DRAM capacitor according to the embodiment as shown in FIGS. 3A through 3M.

As shown in FIGS. 3A and 4A, a semiconductor substrate 300 having a gate structure and word line thereon is provided. The gate structure includes a gate layer 302a, a cap layer 304a and spacers 306a, while the word line includes a conductive layer 302b, a cap layer 304b and spacers 306b. There is a dielectric layer 308 deposited over the substrate and covering the gate structure and the word line. Furthermore, a bit line 310 that passes through the dielectric layer 308 and between the word line and the gate structure is also formed. The bit line 310 is electrically connected to the substrate 300. Next, a dielectric layer 312 and an insulation layer 314 are sequentially formed over the dielectric layer 308 and the bit line 310. The insulation layer 314 can be a silicon-rich oxide (SRO) layer or a silicon nitride layer.

Figure 3B:
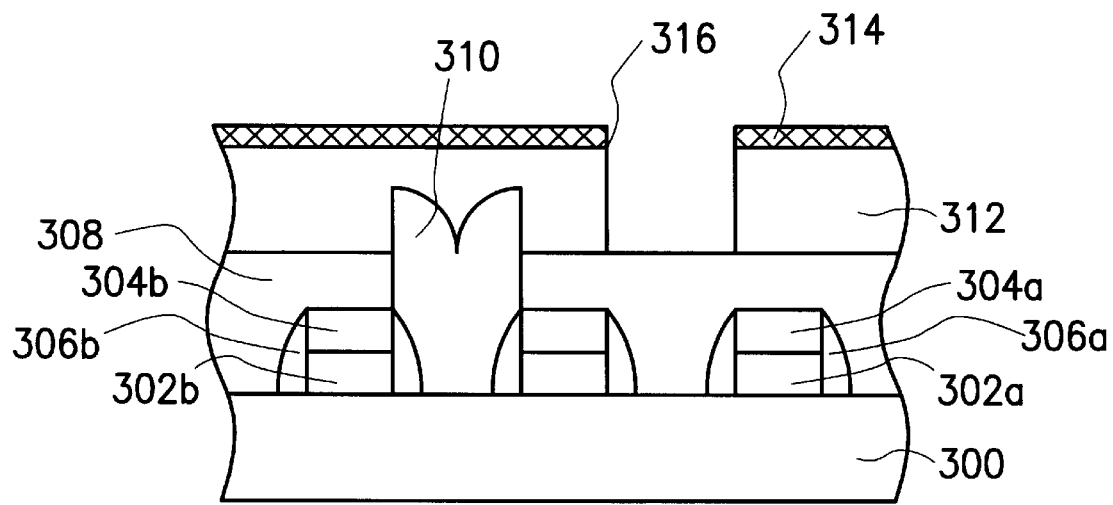
Figure 4B:
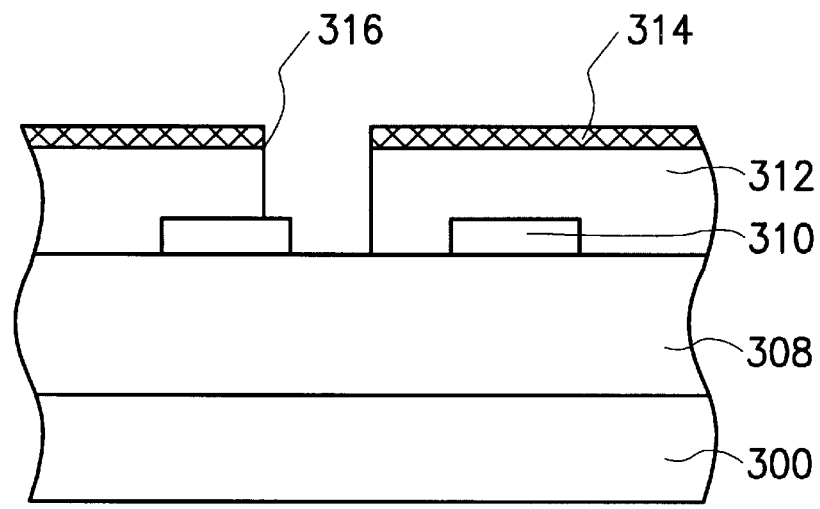

As shown in FIGS. 3B and 4B, a mask patterning operation is carried out to remove a portion of the insulation layer 314 and the dielectric layer 312, thus exposing a portion of the dielectric layer 308. Consequently, a via hole 316 is formed between two adjacent gate structures. Due to possible misalignment, a portion of the bit line 310 may be exposed after the via hole 316 is formed as shown in FIG. 4B.

Figure 3C:
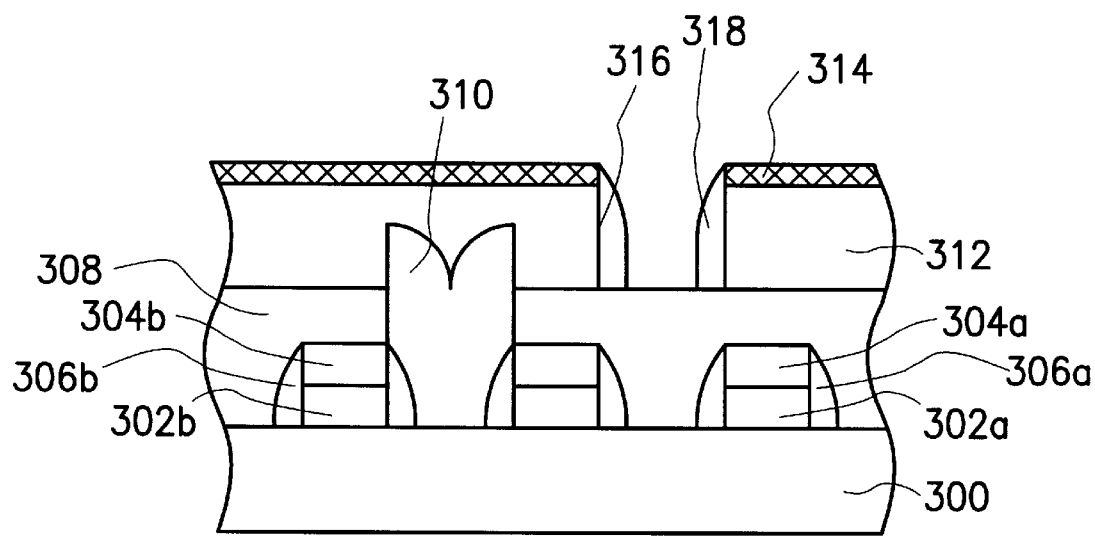
Figure 4C:
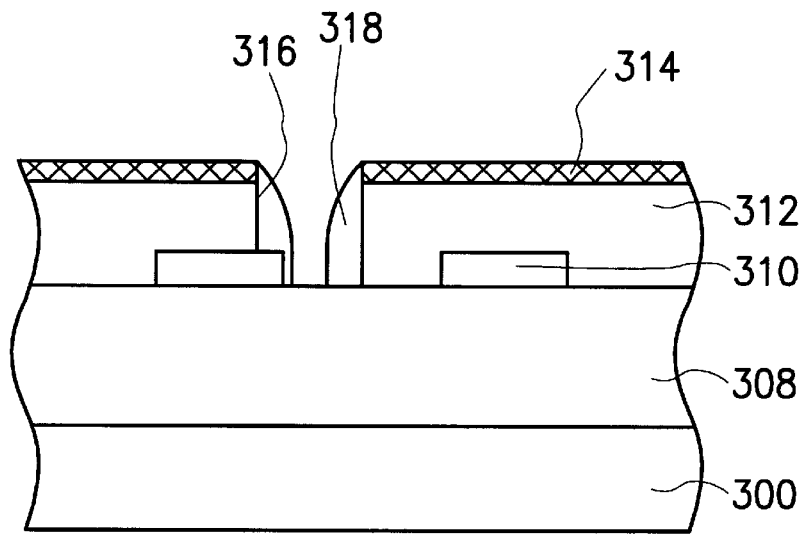

As shown in FIG. 3C and 4C, insulating spacers 318 are formed on the sidewalls of the via hole 316. The insulating spacers 318 can be a silicon-rich oxide or a silicon nitride layer formed by first depositing insulating material into the via hole 316 and over the insulation layer 314, and then etching back the insulating layer (not shown in the figure) to remove the insulating material above the insulation layer 314 and outside the via hole 316. In this processing step, the bit line 310 exposed by the via hole 316 due to the misalignment as shown in FIG. 4B is now covered by the insulating spacers 318. Hence, the bit line 310 is isolated from any subsequently deposited conductive layer, thereby preventing any probable short-circuiting of devices.

Figure 3D:
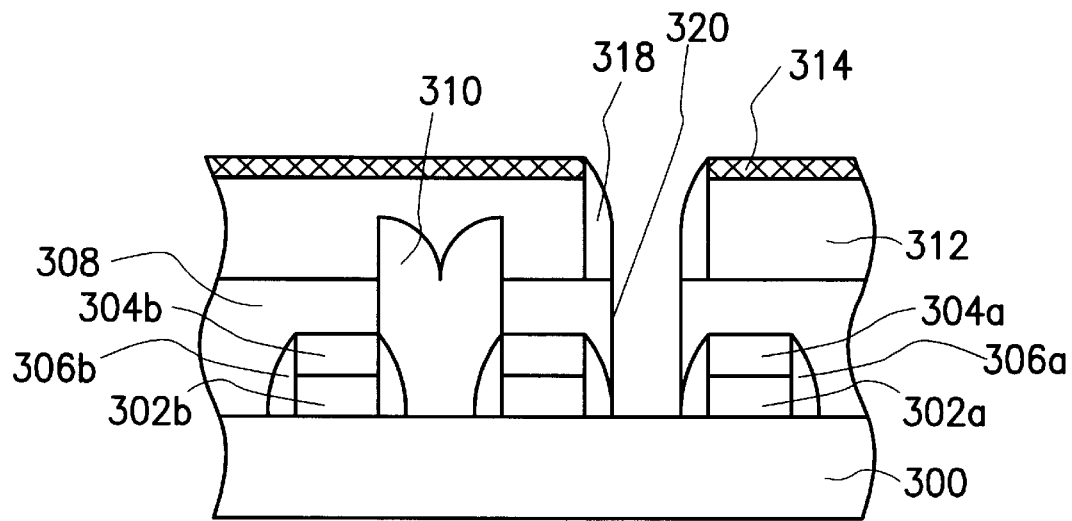
Figure 4D:
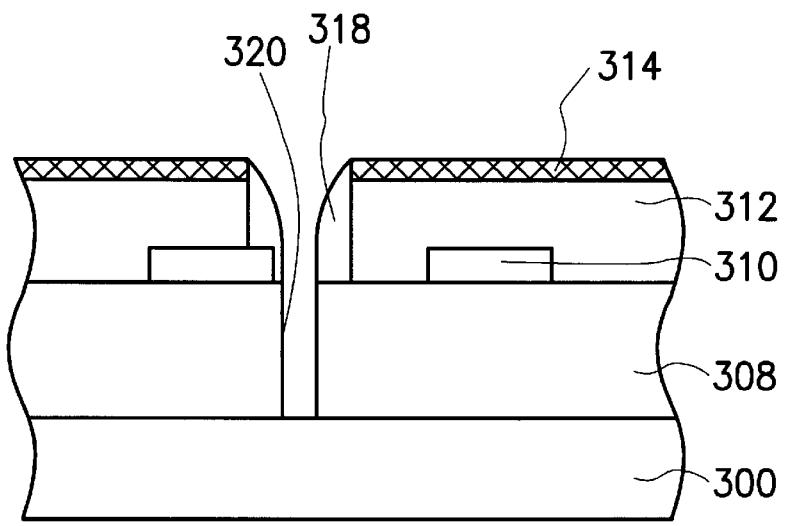

As shown in FIGS. 3D and 4D, through the via hole 316 (FIG. 3C) between the spacers 318, the exposed dielectric layer 308 is removed to form a node contact opening 320. The node contact opening 320 is located between two adjacent gate structures and is in direct contact with the surface of the semiconductor substrate 300. In this processing step, the insulating spacers 318 serve as a self-aligning guide for fabricating the node contact opening 320. Consequently, the cross-sectional dimensions of a node contact opening can be further reduced. In addition, spacers 306a on the sidewalls of the gate structures also serve as a self-aligning guide when the node contact opening 320 is formed.

Figure 3E:
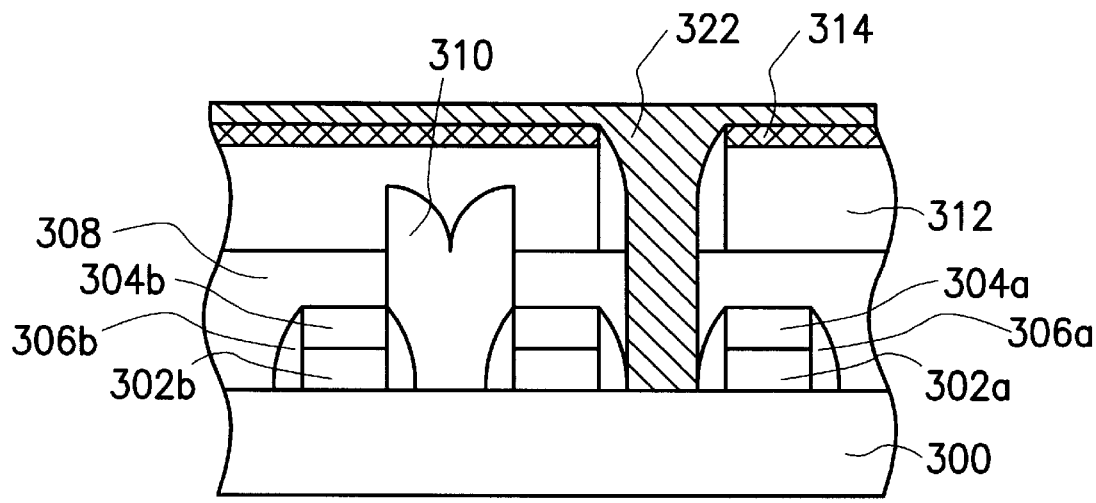
Figure 4E:
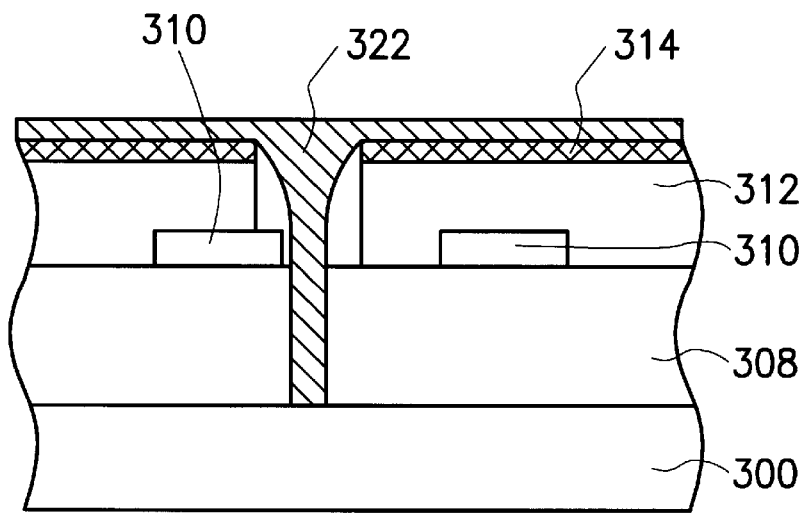

As shown in FIGS. 3E and 4E, polysilicon is deposited into the node contact opening 320 and over the insulation layer 314 to form a polysilicon layer 322.

Figure 3F:
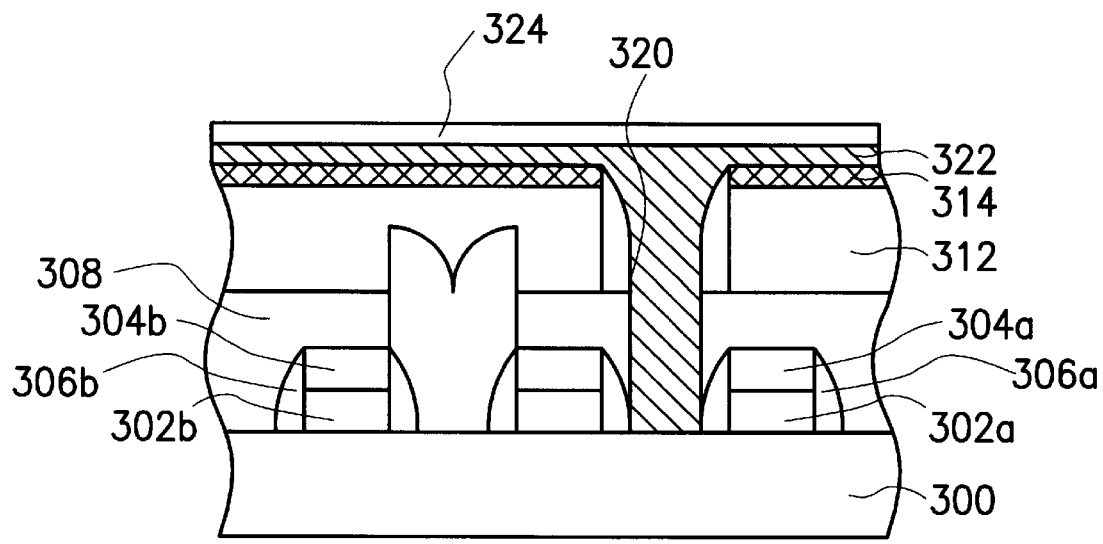
Figure 4F:
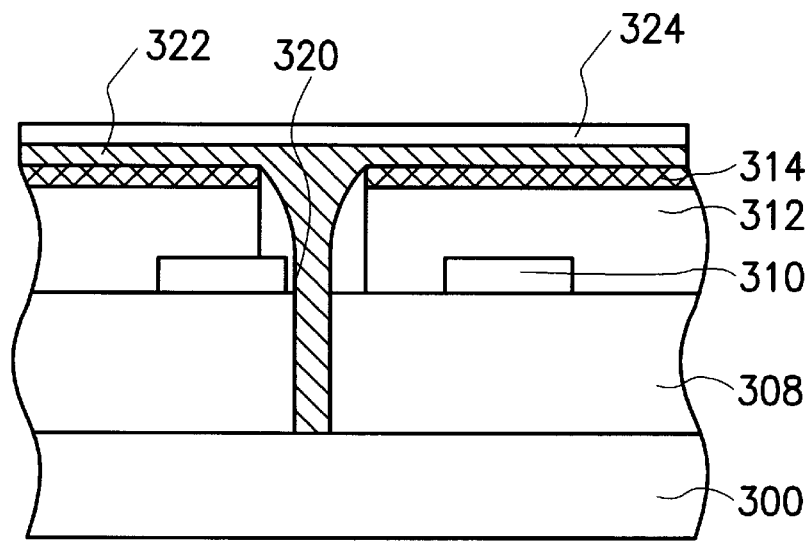
Figure 3G:
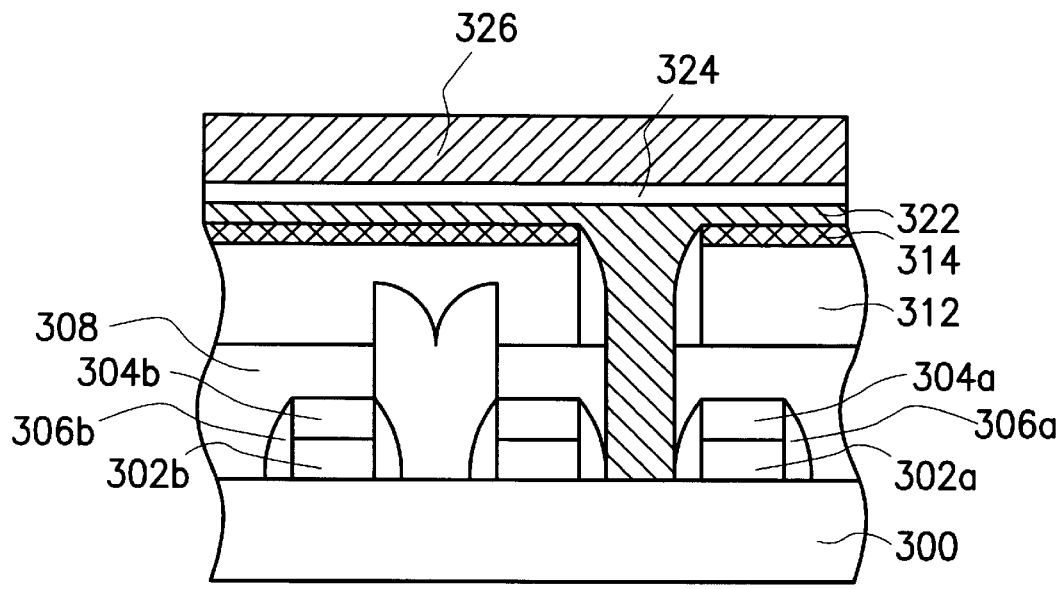
Figure 4G:
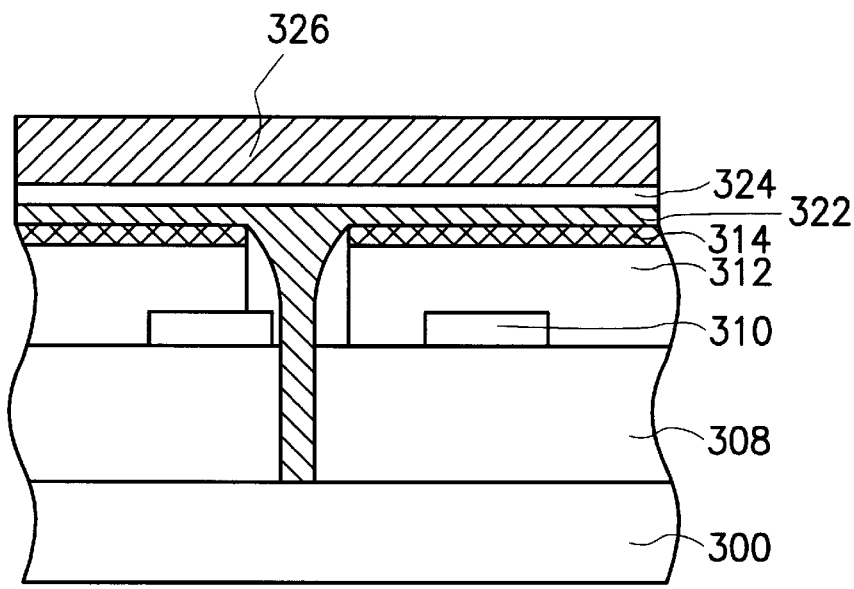

In the subsequent step, as shown in FIGS. 3F and 4F, a dielectric layer 324 having a thickness of about 500 Å is formed over the polysilicon layer 322. The dielectric layer 324 can be a silicon dioxide layer. Thereafter, a thick polysilicon layer 326 having a thickness of between 7000 Å to 1000 Å is formed over the dielectric layer 324, hence forming a structure as shown in FIGS. 3G and 4G.

Figure 3H:
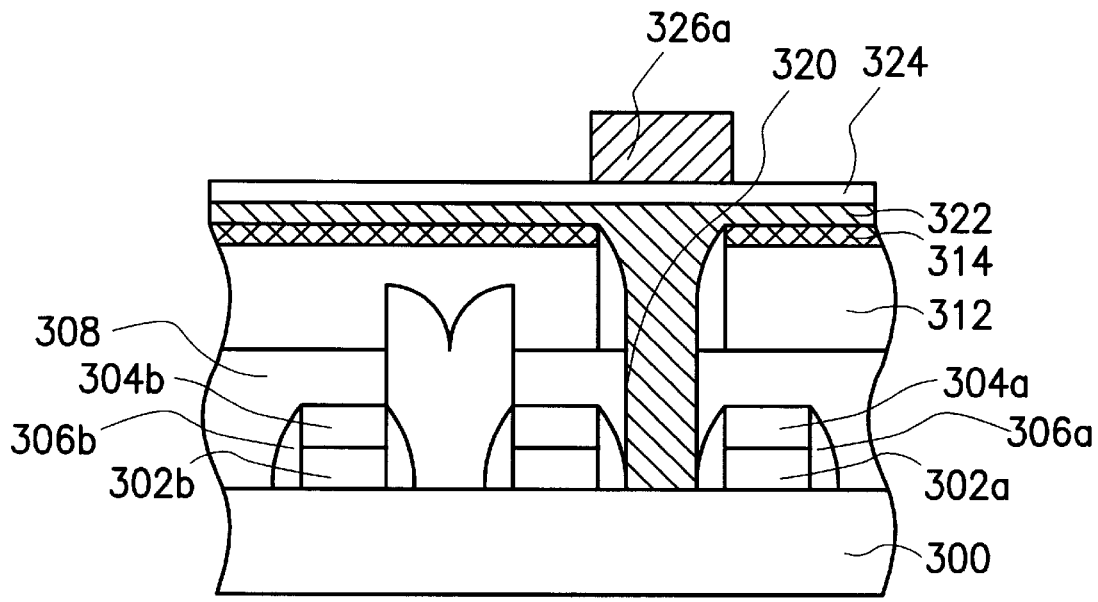
Figure 4H:
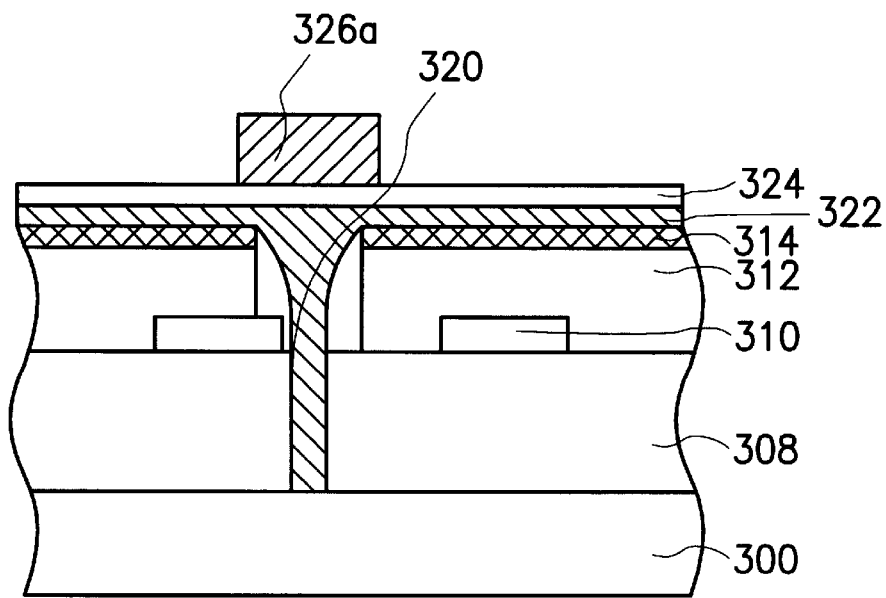

As shown in FIGS. 3H and 4H, photolithographic and etching processes are carried out using the dielectric layer 324 as a barrier stop layer to remove a portion of the polysilicon layer 326. Ultimately, only a portion of the polysilicon layer 326a remains on top of the node contact opening 320.

Figure 3I:
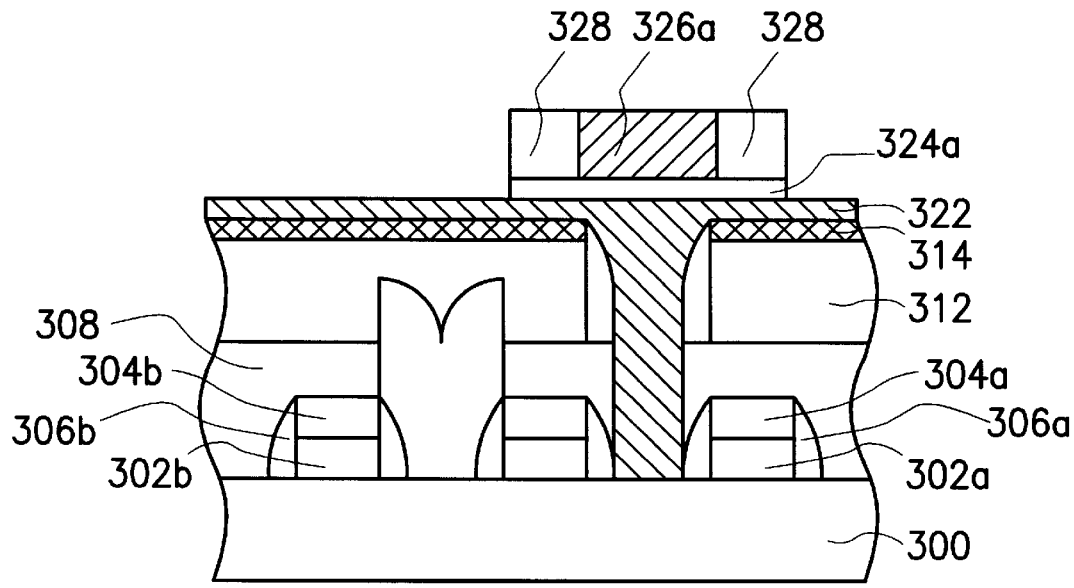
Figure 4I:
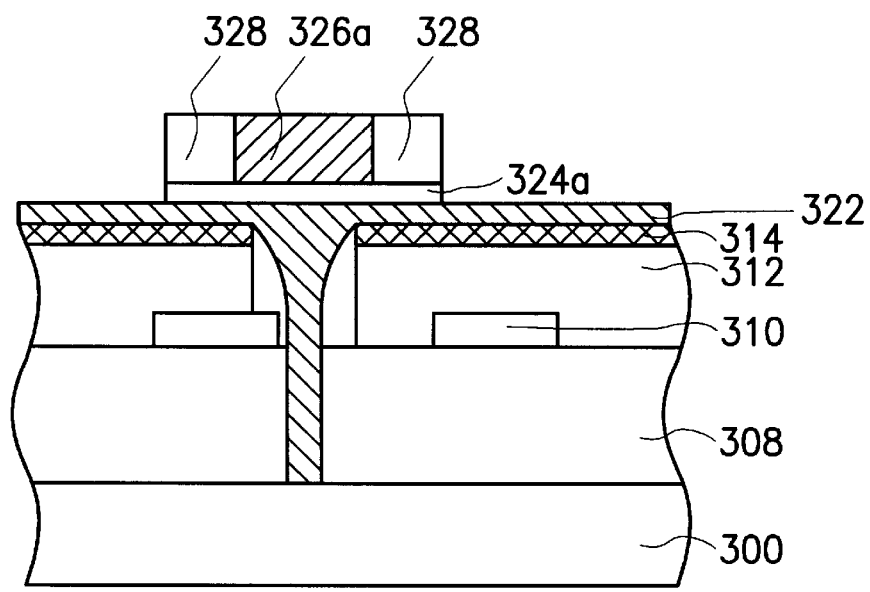

As shown in FIGS. 3I and 4I, dielectric spacers 328 having a thickness of about 1000 Å are formed on the sidewalls of the polysilicon layer 326a. The dielectric spacers 328 can be silicon dioxide layers formed by first depositing dielectric material over the structure as shown in FIGS. 3H and 4H. Then, the dielectric layer (not shown in the figure) is etched back to form the dielectric spacers 328 using the polysilicon layer 322 as an etching barrier layer. A portion of the dielectric layer 324 not covered by the polysilicon layer 326a and spacers 328 is also removed when the spacers 328 are formed. Ultimately, only a portion of the dielectric layer 324a that lies above the node contact opening 320 is retained.

Figure 3J:
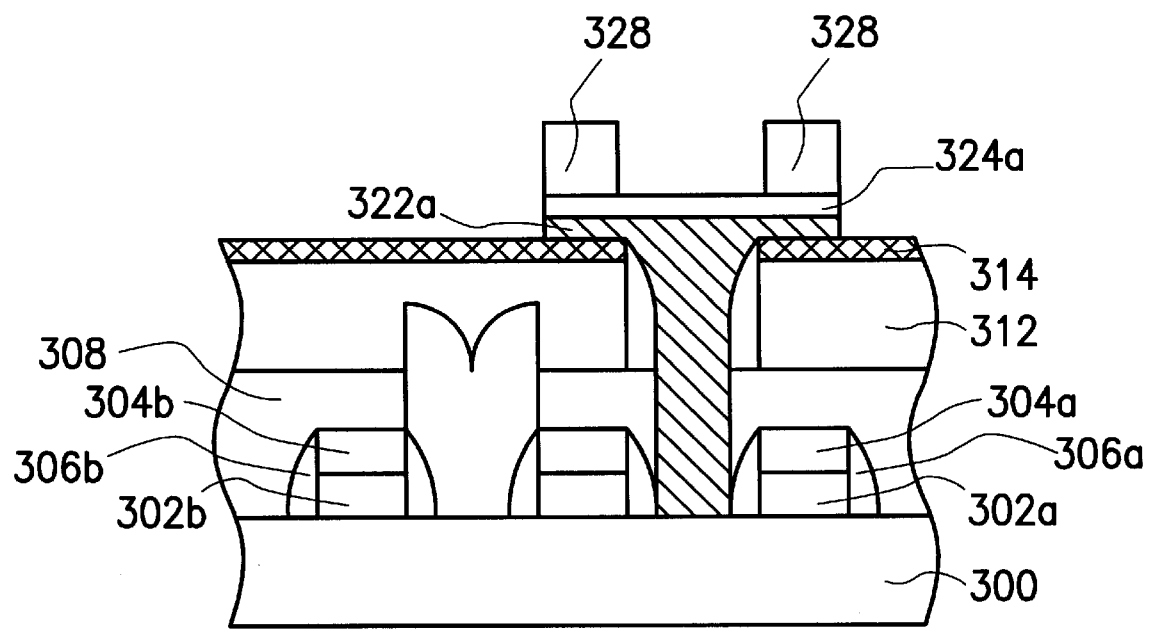
Figure 4J:
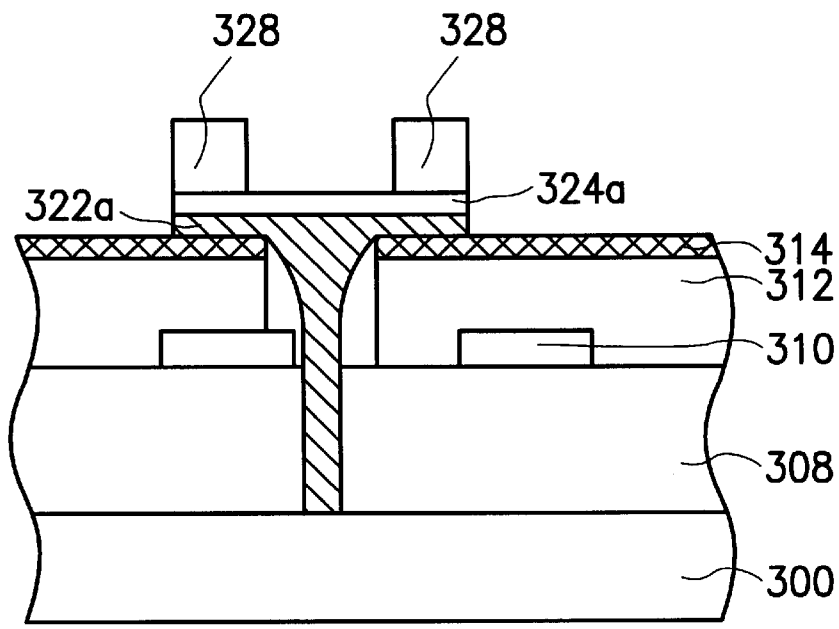

As shown in FIGS. 3J and 4J, the exposed polysilicon layers 326a and 322 are removed while using the insulation layer 314 as an etching barrier layer. Finally, the polysilicon layer 322a underneath the dielectric layer 324a and enclosed within the node contact opening 320 is retained.

Figure 3K:
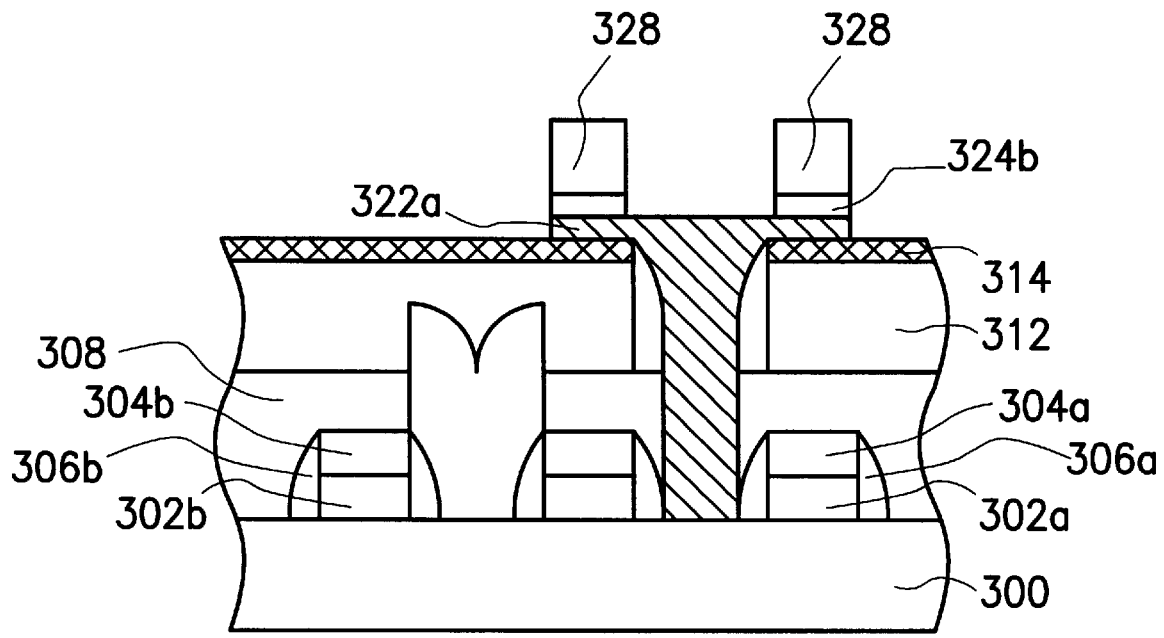
Figure 4K:
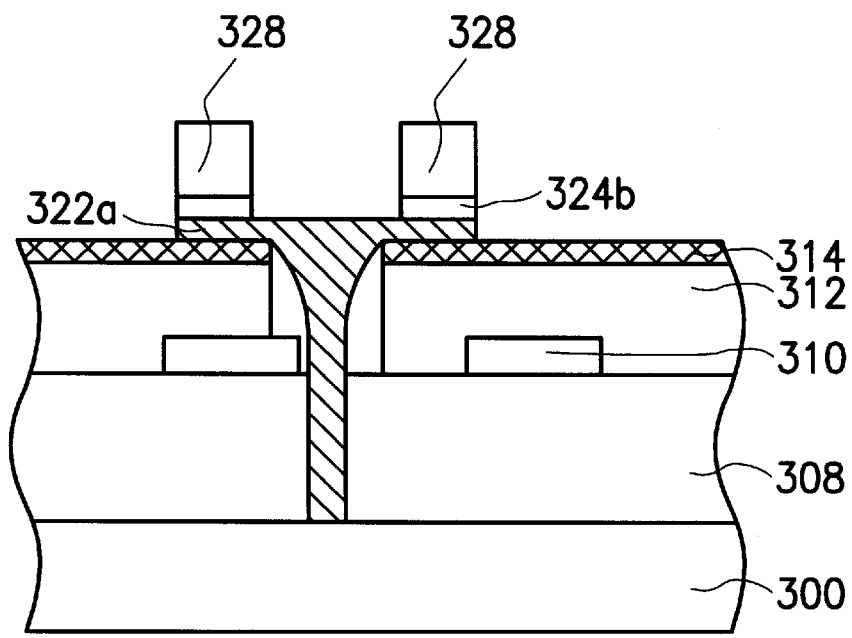

As shown in FIGS. 3K and 4K, the dielectric layer 324a between the dielectric spacers 328 is removed to expose a portion of the polysilicon layer 322a. This processing step produces a pillar-like dielectric layer composed of the dielectric layer 324b and the dielectric spacer 328. The dielectric layer 324a can be removed using, for example, an etching back operation.

Figure 3L:
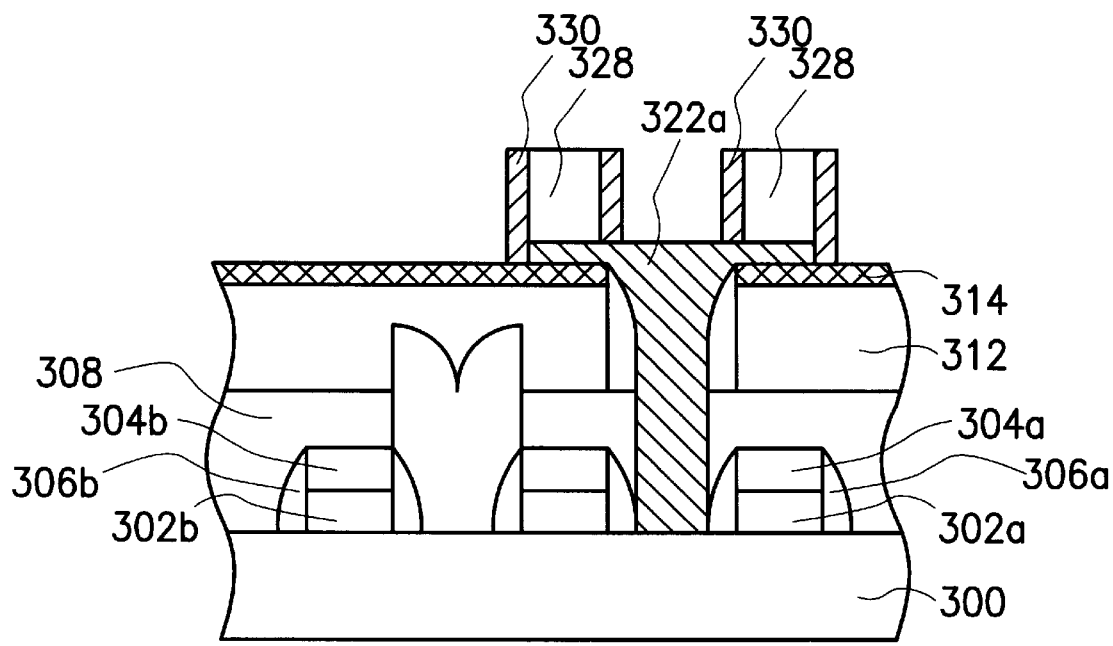
Figure 4L:
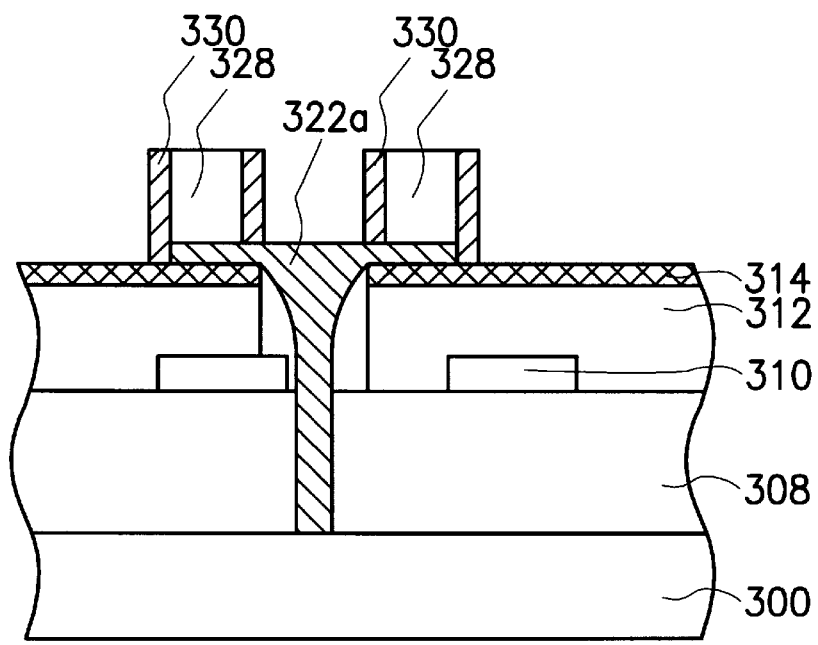

As shown in FIGS. 3L and 4L, polysilicon spacers 330 are formed on the sidewalls of the pillar-like structure. The method of forming the polysilicon spacers 330 is similar to the process for forming dielectric spacers 328 in FIGS. 3I and 4I, only the material is changed from dielectric to polysilicon.

Figure 3M:
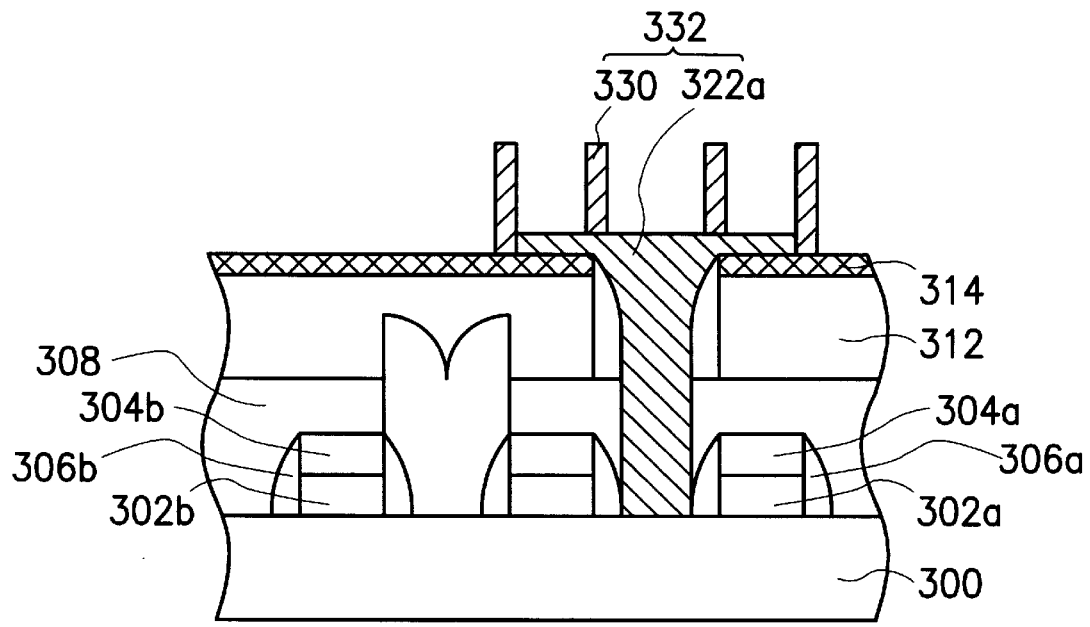
Figure 4M:
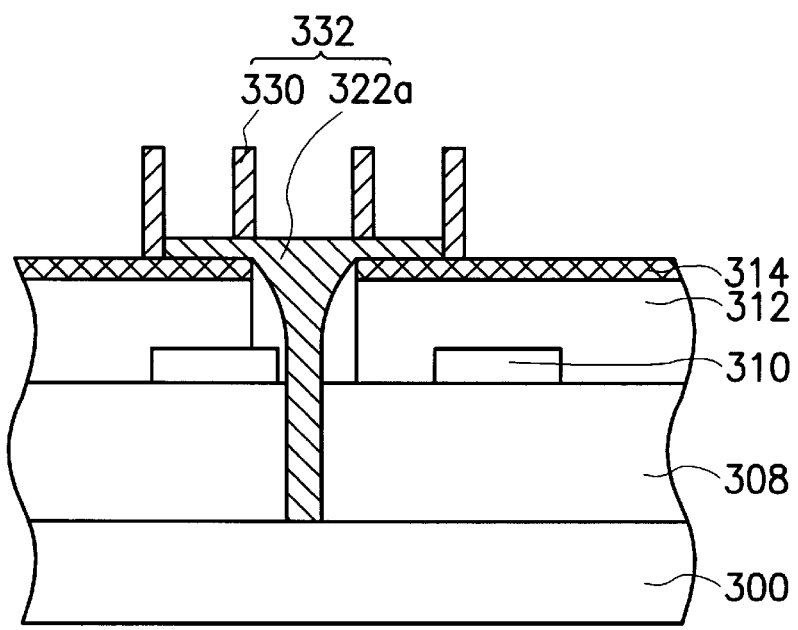

As shown in FIGS. 3M and 4M, the pillar-like dielectric layer between the polysilicon spacers 330 are removed. Hence, a lower electrode 332 having a fork-shaped structure with four prongs is formed. Finally, a dielectric layer is formed over the lower electrode 332, and then an upper electrode is formed over the dielectric layer. Since these operations are not directly related to this invention, detail description is omitted here.

In summary one major aspect of this invention is the utilization of dielectric spacers and the sidewall spacers of gate structures as self-aligning guides for etching out a node contact opening. Hence, the node contact opening can align accurately on the target position above the substrate between two neighboring gate structures.

Another aspect of this invention is that the sidewalls of the via hole have dielectric spacers. Consequently, cross-sectional dimension of the node contact can be reduced. Furthermore, the dielectric spacers can protect the bit lines that are exposed due to misalignment of the via hole. Therefore, any short-circuiting between the bit line and the node contact can be prevented, and hence product yield can be increased.

In a third aspect of this invention, the formation of pillar-like dielectric layers followed by the formation of polysilicon spacers on the sidewalls of these pillar-like dielectric layers eventually creates a fork-shaped lower electrode having four prongs. Hence, surface area of the lower electrode is greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a DRAM capacitor, comprising the steps of:

providing a semiconductor substrate;

forming a first dielectric layer over the substrate;

forming a bit line that passes through the first dielectric layer and couples with the substrate;

forming a second dielectric layer and an insulation layer over the first dielectric layer and the bit line;

patterning the insulation layer and the second dielectric layer with a mask to form a via hole that exposes a portion of the first dielectric layer;

forming insulating spacers on the sidewalls of the via hole;

removing the exposed first dielectric layer through the insulating spacers lined via hole to form a node contact opening that connects with a specific contact region in the substrate;

forming a first polysilicon layer that fills the node contact opening and covers the insulation layer;

forming a third dielectric layer and a second polysilicon layer over the first polysilicon layer;

patterning with a mask to remove a portion of the second polysilicon layer so that the third dielectric layer is exposed thereby forming a remaining second polysilicon layer;

forming dielectric spacers on the sidewalls of the remaining second polysilicon layer;

removing the remaining second polysilicon layer to expose the third dielectric layer, and removing a portion of the first polysilicon layer to expose the insulation layer;

removing the third dielectric layer between the dielectric spacers so that remaining portions of the third dielectric layer and the dielectric spacers together form pillar-shaped dielectric layers;

forming a second polysilicon spacers on the sidewalls of the pillar-shaped dielectric layers; and removing the pillar-shaped dielectric layers.

2. The method of claim 1, wherein the step of forming the insulation layer includes depositing silicon-rich oxide to form an oxide layer.

3. The method of claim 2, wherein the step of forming the insulating spacers includes depositing silicon-rich oxide.

4. The method of claim 1, wherein the insulation layer includes a silicon nitride spacer.

5. The method of claim 4, wherein the step of forming the insulating spacers includes depositing silicon nitride.

6. The method of claim 1, wherein the third dielectric layer has a thickness of about 500 Å.

7. The method of claim 1, wherein the second polysilicon layer has a thickness in the range of about 7000 Å to 10000 Å.

8. The method of claim 1, wherein the dielectric spacer has a thickness of about 1000 Å.

9. The method of claim 1, wherein the step of patterning with a mask to remove a portion of the second polysilicon layer further includes aligning the remaining second polysilicon layer directly above the node contact opening.

10. The method of claim 1, wherein the step of forming the third dielectric layer includes depositing oxide material to form an oxide layer.

11. A method of manufacturing a DRAM capacitor, comprising the steps of:

provding a semiconductor substrate that has a gate structure and a word line already formed thereon;

forming a first dielectric layer over the substrate;

forming a bit line that passes through the first dielectric layer, which is located between the gate structure and the word line, and connects electrically with a specific contact region in the substrate;

forming a second dielectric layer and a silicon-rich oxide layer over the first dielectric layer and the bit line;

patterning the silicon-rich oxide layer and the second dielectric layer with a mask to form a via hole that exposes a portion of the first dielectric layer;

forming silicon-rich oxide spacers on the sidewalls of the via hole;

removing the exposed first dielectric layer through the silicon-rich oxide spacers lined via hole to form a node contact opening that couples with the semiconductor substrate;

forming a first polysilicon layer that fills the node contact opening and covers the silicon-rich oxide layer;

forming a second oxide layer and a second polysilicon layer over the first polysilicon layer;

patterning with a mask to remove a portion of the second polysilicon layer so that the second oxide layer is exposed thereby forming a remaining second polysilicon layer;

forming oxide spacers on the sidewalls of the remaining second polysilicon layer;

removing the remaining second polysilicon layer to expose the second oxide layer, and removing a portion of the first polysilicon layer to expose the silicon-rich oxide layer;

removing the second oxide layer between the oxide spacers so that remaining portions of the second oxide layer and the oxide spacers together form pillar-shaped oxide layers;

forming a second polysilicon spacers on the sidewalls of the pillar-shaped oxide layers; and removing the pillar-shaped oxide layers.

12. The method of claim 11, wherein the second oxide layer has a thickness of about 500 Å.

13. The method of claim 11, wherein the second polysilicon layer has a thickness in the range of about 700 Å to 1000 Å.

14. The method of claim 11, wherein the oxide spacer has a thickness of about 1000 Å.

* * * * *